Dec. 12, 1950 D. H. ANDREWS 2,533,908

RADIO SIGNAL DETECTOR

Filed Nov. 25, 1947

Inventor

Donald H. Andrews

By Stowell & Evans

Patented Dec. 12, 1950

2,533,908

UNITED STATES PATENT OFFICE 2,533,908

RADIO SIGNAL DETECTOR

Donald H. Andrews, Baltimore, Md., assignor to Research Corporation, New York, N. Y., a corporation of New York Application November 25, 1947, Serial No. 787,959

3 Claims. (Cl. 250—25)

This invention relates to a new radio signal detector and to radio signal receiver embodying the same.

The signal detector of the invention comprises essentially a conductive member, such as a wire, strip, film or coil, maintained at a temperature immediately below the superconductivity transition point of the member.

The electrical resistance and magnetic permeability of a conductive substance decrease with decreasing temperature. At critical transition temperatures which differ for different substances, the electrical resistance and magnetic permeability suddenly fall substantially to zero. The transition from a condition of normal conductivity and permeability to superconductivity and extremely low permeability occurs, in general, over a temperature range amounting to a small fraction of one degree. This range, the position and extent of which depends on the particular conductive material, may be termed the superconducting transition range, and the temperature at which the rapid drop in electrical resistance begins to occur, that is, the upper end of the superconductive transition range, will be termed the superconductivity transition temperature.

I have found that conductive substances, maintained at a temperature immediately below the superconductivity transition temperature of the substance, both within and below the superconductivity transition range, act as effective detectors of radio frequency signals. While a number of metals and metallic compounds are suitable for providing the conductive members, such as tin, lead, aluminum, columbium (niobium), and columbium (niobium) carbide with transition temperatures of about 3.7° K., 7° K., 1° K., 9° K. and 10° K., respectively, columbium (niobium) nitride (CbN) is particularly useful because its transition temperature is somewhat above the triple point of hydrogen at 14° K., so that liquid hydrogen under vacuum may be used as a refrigerating medium.

A radio receiver embodying the principles of the invention may comprise a tuned circuit including a conductive member, for example, columbium nitride, maintained at a temperature immediately below its superconductivity transition temperature, an audio frequency amplifying circuit coupled to the tuned circuit, and a loudspeaker, cathode ray oscilloscope, or other audio frequency responsive device connected to the output of the amplifying circuit. Such a receiver will effectively receive modulated radio frequency signals over the frequency range of at least 0.1 to 20 megacycles. The receiver of the invention is characterized by a very favorable signal-to-noise ratio in the reception of audio frequency modulated radio frequency signals.

The invention will be more particularly described for the purpose of illustration with reference to the accompanying drawings, in which.

Figure 1:
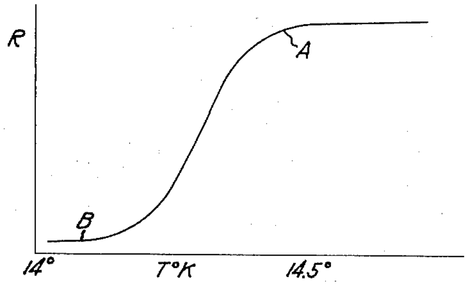
Fig. 1 is a graph illustrating the relation of the resistance of columbium nitride to its temperature in the neighborhood of its superconducting transition range.

Fig. 1 shows the relation of the resistance of a typical sample of columbium nitride at temperatures shortly above the triple point of hydrogen. It will be seen that in the sample illustrated the resistance begins to drop very rapidly at a temperature just below 14.5° K. indicated by point A, representing the superconductivity transition temperature as defined herein, and has fallen to a very low level within a small part of a degree at point B. The range between points A and B represents the superconductivity transition range, within which the particular sample of columbium nitride illustrated may be effectively used as a radio signal detecting element in accordance with the invention.

Figure 2:
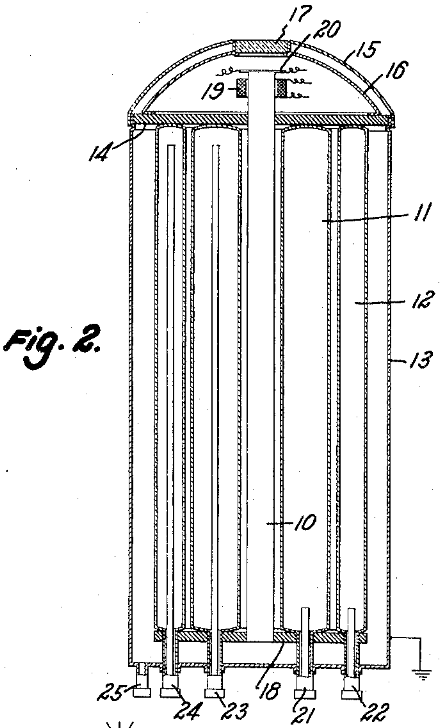
Fig. 2 is a diagrammatic representation in sectional elevation of a cryostat suitable for use in the invention.
Figure 3:
Fig. 3 is a fragmentary detail showing the superconducting member of the device of Fig. 2 in plan view.

The cryostat diagrammatically illustrated in Figs. 2 and 3 comprises a plurality of concentric annular cylindrical copper containers concentrically arranged about a central copper post 10. The innermost container 11 is normally supplied with liquid hydrogen, and the intermediate container 12 with liquid nitrogen. The outer container 13 provides a vacuum jacket for the cryostat. The containers 11 and 12 are mounted at their tops on an insulating spacer 14 which also carries the cover 15 and radiation shield 16. The latter members may advantageously carry a centrally located plastic observation window 17. The post 10 is supported from the bottom by insulating ring 18. The containers are provided with suitable inlets 21, 22 and vents 23, 24, and a connection 25 for evacuating the cryostat.

Mounted on the top of post 10 is a strip 20 of columbium nitride provided at each end with suitable conductors. The columbium nitride ribbon is attached to, and electrically insulated from, the post by a thin layer of phenol-formaldehyde resin lacquer.

Fine adjustment of the temperature of the top of the post and of the columbium nitride ribbon is maintained by means of heating coil 19 wound around the upper end of the post.

When a supply of liquid hydrogen is provided in container 11 and a supply of liquid nitrogen in container 12, and the cryostat is evacuated, the hydrogen is maintained at the triple point 14° K. The upper end of post 10 is then readily maintained in the transition range of the columbium nitride by a suitable current in coil 19.

Figure 4:
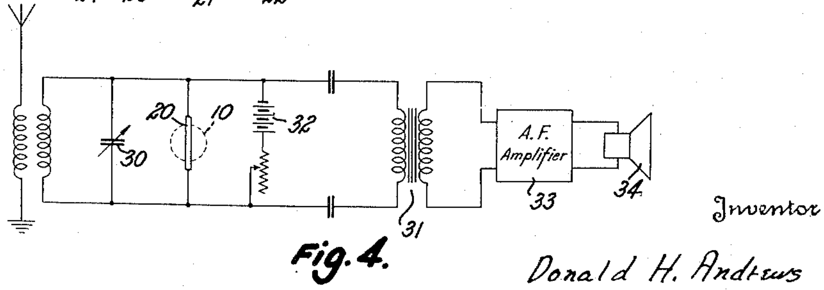
Fig. 4 is a circuit diagram of a radio receiver embodying the principles of the invention.

In the circuit diagram of Fig. 4, the superconductive strip 20 is shown in a tuned circuit including variable capacity 30 and the primary of audio frequency transformer 31. An adjustable source of current 32 may be included in the circuit, as a small current through the strip 20 may improve its sensitivity as a detector and the current may be used in adjusting the temperature of the strip.

The secondary of transformer 31 forms part of an audio frequency circuit including audio frequency amplifier 33 the output of which is supplied to loudspeaker 34.

It will, of course, be obvious to those skilled in the art of radio communication that the circuit shown in Fig. 4 is subject to a wide variety of modification of circuit elements and their arrangement without departing from the principles of the invention as described herein and as defined in the claims hereof.

I claim:

1. In a radio signal receiver, a tuned circuit including a columbium nitride member maintained at a temperature below its superconductivity transition temperature.

2. A radio receiver comprising in combination a tuned circuit including a conductive member, means for maintaining said member at a temperature below its superconductivity transition temperature, an audio frequency amplifying circuit coupled to said tuned circuit, and an audio frequency responsive device connected to the output of said audio frequency amplifying circuit.

3. A radio receiver comprising in combination a tuned circuit including a columbium nitride member, means for maintaining said member at a temperature below its superconductivity transition temperature, an audio frequency amplifying circuit coupled to said tuned circuit, and an audio frequency responsive device connected to the output of said audio frequency amplifying circuit.

DONALD H. ANDREWS.

REFERENCES CITED

The following references are of record in the file of this patent:

UNITED STATES PATENTS

| Number | Name | Date |
|---|---|---|
| 2,128,750 | Kriebel | Aug. 30, 1938 |
| 2,189,122 | Andrews | Feb. 6, 1940 |

OTHER REFERENCES

Burton, "Superconductivity," Univ. of Toronto Press, 1934, Scientific Library.

National Bureau of Standards, Journal of Research, volume 20, Research Paper 1070, published February 1938, volume 20.